(12) United States Patent
Hsu et al.

(10) Patent No.: US 9,401,376 B2
(45) Date of Patent: Jul. 26, 2016

(54) THIN FILM TRANSISTOR AND ACTIVE MATRIX ORGANIC LIGHT EMITTING DIODE ASSEMBLY AND METHOD FOR MANUFACTURING THE SAME

(71) Applicant: EverDisplay Optronics (Shanghai) Limited, Shanghai (CN)

(72) Inventors: Chia-Che Hsu, Shanghai (CN); Chia-Chi Huang, Shanghai (CN); Wei-Ting Chen, Shanghai (CN); Min-Ching Hsu, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/309,562

(22) Filed: Jun. 19, 2014

(65) Prior Publication Data

US 2014/0374718 A1    Dec. 25, 2014

(30) Foreign Application Priority Data

Jun. 21, 2013    (CN) .......................... 2013 1 0251908

(51) Int. Cl.
*H01L 27/12*    (2006.01)
*H01L 29/423*    (2006.01)
(Continued)

(52) U.S. Cl.
CPC ........ *H01L 27/127* (2013.01); *H01L 29/42384* (2013.01); *H01L 29/4908* (2013.01); *H01L 29/66757* (2013.01); *H01L 29/78621* (2013.01); *H01L 27/3244* (2013.01); *H01L 27/3262* (2013.01); *H01L 2029/42388* (2013.01)

(58) Field of Classification Search
CPC ............ H01L 27/127; H01L 29/42384; H01L 29/4908; H01L 29/78621; H01L 29/66757; H01L 2029/42388; H01L 27/3262; H01L 27/3244

See application file for complete search history.

(56) References Cited

U.S. PATENT DOCUMENTS

| | | | |
|---|---|---|---|
| 2002/0104992 | A1 | 8/2002 | Tanabe et al. |
| 2003/0025127 | A1* | 2/2003 | Yanai et al. .................. 257/158 |

(Continued)

FOREIGN PATENT DOCUMENTS

| | | |
|---|---|---|
| JP | 10125928 | 5/1998 |
| JP | 2010125928 A | 5/1998 |

(Continued)

OTHER PUBLICATIONS

Office Action issued May 15, 2015 by the Korean Office.
(Continued)

*Primary Examiner* — John P Dulka
(74) *Attorney, Agent, or Firm* — Yunling Ren; Eaton & Van Winkle

(57) ABSTRACT

The present application provides a thin film transistor, an active matrix organic light emitting diode assembly and a method for manufacturing the same. The thin film transistor includes: a substrate; a buffer layer on the substrate; a semiconductor layer on the buffer layer, including a source region, a drain region and a channel region; a first gate insulating layer covering the semiconductor layer; a second gate insulating layer foot on the first gate insulating layer, a width of the second gate insulating layer foot being smaller than a width of the first gate insulating layer; and a gate electrode on the second gate insulating layer foot; wherein a part of the first gate insulating layer that is on the semiconductor layer has a flat upper surface. The present application may obtain better implantation profiles of source region and drain region, thereby obtaining better uniformity in TFT performance.

10 Claims, 23 Drawing Sheets

(51) Int. Cl.
　　　*H01L 29/49*　　(2006.01)
　　　*H01L 29/66*　　(2006.01)
　　　*H01L 29/786*　(2006.01)
　　　*H01L 27/32*　　(2006.01)

(56) References Cited

U.S. PATENT DOCUMENTS

| | | | |
|---|---|---|---|
| 2005/0090066 | A1 | 4/2005 | Zhu et al. |
| 2006/0244107 | A1* | 11/2006 | Sugihara et al. ............... 257/646 |
| 2007/0296003 | A1* | 12/2007 | Park .................. H01L 29/42384 257/288 |
| 2012/0139043 | A1 | 6/2012 | Wu |

FOREIGN PATENT DOCUMENTS

| | | | |
|---|---|---|---|
| JP | 2002190479 | A | 7/2002 |
| JP | 2004247413 | A | 9/2004 |
| JP | 2005064123 | A | 3/2005 |
| JP | 2005333107 | A | 12/2005 |
| JP | 2006313776 | A | 11/2006 |
| JP | 2007013145 | A | 1/2007 |
| JP | 2007115750 | A | 5/2007 |
| JP | 2007142082 | A | 6/2007 |
| JP | 2007142367 | A | 6/2007 |
| JP | 2007311542 | A | 11/2007 |
| KR | 1020030081894 | A | 10/2003 |

OTHER PUBLICATIONS

Office Action issued May 28, 2015 by the Taiwan Office.
Office Action issued by the Japanese Office.
Office Action issued Aug. 24, 2015 by the TW Office.
Office Action issued Aug. 7, 2015 by the KR Office.(Dividual).
Office Action issued Feb. 8, 2016 by the JP Office.

* cited by examiner

THIN FILM TRANSISTOR AND ACTIVE MATRIX ORGANIC LIGHT EMITTING DIODE ASSEMBLY AND METHOD FOR MANUFACTURING THE SAME

CROSS REFERENCE TO RELATED APPLICATIONS

The present application claims priority under 35 U.S.C. §119 to Chinese Patent Application No. 201310251908.5, filed on Jun. 21, 2013, the entire contents of which are incorporated herein by reference.

TECHNICAL FIELD

The present disclosure relates to an active matrix organic light emitting display, and in particular to a Thin Film Transistor (TFT), an Active Matrix Organic Light Emitting Diode (AMOLED) assembly including the TFT and a method for manufacturing the TFT.

BACKGROUND

Low Temperature Poly-Silicon (LTPS) process is usually employed in TFT array assembly portion of an AMOLED. Qualities of the TFTs and the array assembly including the TFTs will decide final display quality of the AMOLED.

In processes for manufacturing an AMOLED_LTPS TFT (see FIGS. 1~2), using a photoresist pattern 122 as a mask, a part of a gate metal layer and a gate insulating layer is etched, and thus a gate line (not shown), a gate electrode 120' and e.g. a silicon nitride foot 118' below the gate electrode are formed. At this time, a lower insulating layer such as a silicon oxide layer 116' may also be etched, which results in a silicon oxide loss (as indicated by the circle in FIG. 1). As a result, there exists difference in dopant implantation profiles of a source region S and a drain region D, which therefore results in difference in electrical property (such as Ion, Ioff, Vth, mobility, etc.) of final products.

Thus, a method for reducing the insulating layer loss when manufacturing a TFT is needed.

The above information disclosed in the background portion is only for purpose of enhancing understanding of the background of the present disclosure, and thus it may include information which does not constitute prior art known to one of ordinary skill in this art.

SUMMARY OF THE INVENTION

The present application discloses a TFT, an AMOLED assembly including the TFT and a method for manufacturing the same, which may obtain better implantation profiles of a source region and a drain region, thereby obtaining better uniformity in TFT performance.

Other properties and advantages of the present disclosure will become clear through the following detailed description, or may be learned partially by the practice of the present disclosure.

According to an aspect of the present disclosure, a TFT is provided, which includes: a substrate; a buffer layer formed on the substrate; a semiconductor layer formed on the buffer layer, the semiconductor layer comprising a source region, a drain region and a channel region; a first gate insulating layer configured to cover the semiconductor layer, the first gate insulating layer comprising a first width; a second gate insulating foot formed on the first gate insulating layer, the second gate insulating layer foot comprising a second width, the width of the second gate insulating layer foot being smaller than the width of the first gate insulating layer; and a gate electrode formed on the second gate insulating layer foot; wherein a part of the first gate insulating layer on the semiconductor layer has a flat upper surface.

The first gate insulating layer may be a silicon oxide layer.

The second gate insulating layer foot may include silicon nitride.

The semiconductor layer may include LTPS.

The gate electrode may be formed of at least one material selected from the group consisting of molybdenum, aluminum, an alloy of aluminum and nickel, an alloy of molybdenum and tungsten, chromium, and copper.

The second gate insulating layer foot may have a protrusion, such that a partial thickness of the second gate insulating layer foot is larger than the rest of the second gate insulating layer foot.

The semiconductor layer may further include two second Lightly Doped Drain (LDD) regions respectively adjacent to the source region and the drain region and two first LDD regions respectively adjacent to the two second LDD regions, and wherein the second LDD regions have a doping concentration lower than that of the first LDD regions.

According to another aspect of the present disclosure, a method for manufacturing a TFT is provided, which includes: preparing a substrate having a buffer layer thereon; forming a semiconductor layer on the buffer layer; forming a first gate insulating layer covering the semiconductor layer; forming a first photoresist layer covering the first gate insulating layer and performing patterning so as to form a first photoresist pattern, the first photoresist pattern including an opening exposing a middle part of the semiconductor layer; forming a second gate insulating layer on the first photoresist pattern, the second gate insulating layer covering an upper surface of the first photoresist pattern, sidewall surfaces within the opening and exposed surface of the semiconductor layer; depositing a gate metal layer on the second gate insulating layer, the gate metal layer not completely filling the opening; applying a second photoresist layer on the gate metal layer and baking the second photoresist layer; removing a part of the second photoresist layer so as to leave a second photoresist pattern in the opening, a top surface of the second photoresist pattern being lower than a top surface of the gate metal layer; using the second photoresist pattern as a mask, selectively removing a part of the gate metal layer by wet etching so as to form a gate metal pattern; using the second photoresist pattern and the gate metal pattern as masks, selectively removing a part of the second gate insulating layer by wet etching so as to form a second gate insulating layer foot; using the second photoresist pattern as a mask, performing a secondary etching on the gate metal pattern by wet etching so as to form a gate electrode; and peeling off the first photoresist pattern and the second photoresist pattern.

The first gate insulating layer may be a silicon oxide layer.

The second gate insulating layer may include silicon nitride.

The semiconductor layer may include LTPS.

The gate metal layer may be formed of at least one material selected from molybdenum, aluminum, an alloy of aluminum and nickel, an alloy of molybdenum and tungsten, chromium, and copper.

The second photoresist layer may completely fill the opening and cover a top portion of the gate metal layer.

An exposed upper surface of the gate metal pattern may be flush with an upper surface of the gate metal pattern below the second photoresist pattern.

An exposed upper surface of the second gate insulating layer foot may be flush with an upper surface of the second gate insulating layer foot below the gate metal pattern.

After the first photoresist pattern and the second photoresist pattern are peeled off, the gate electrode and the second gate insulating layer may be used as masks, whereby impurity ions are injected into the semiconductor layer so as to form a source region, a drain region and LDD regions.

The second gate insulating layer foot may have a protrusion, such that a partial thickness of the second gate insulating layer foot is larger than the rest of the second gate insulating layer foot. After the first photoresist pattern and the second photoresist pattern are peeled off, the gate electrode and the second gate insulating layer may be used as masks, whereby impurity ions may be injected into the semiconductor layer so as to form a source region, a drain region, second LDD regions adjacent to the source region/drain region and first LDD regions adjacent to the second LDD regions, wherein the second LDD regions have a doping concentration lower than that of the first LDD regions.

According to a further aspect of the present disclosure, an AMOLED assembly is provided, which includes any one TFT mentioned previously.

According to the technical solutions of the present disclosure, better implantation profiles of a source region and a drain region may be obtained, and thereby better uniformity in TFT performance may be obtained. In addition, because gate insulating layer loss is reduced, a gate breakdown voltage may be increased higher, so as to decrease Gate-Induced Drain Leakage (GIDL) current.

BRIEF DESCRIPTION OF THE DRAWINGS

By the detailed description of exemplary implementations with reference to the drawings, the above and other features and advantages of the present disclosure will become more obvious.

DETAILED DESCRIPTION OF THE EMBODIMENTS

Figure 1:
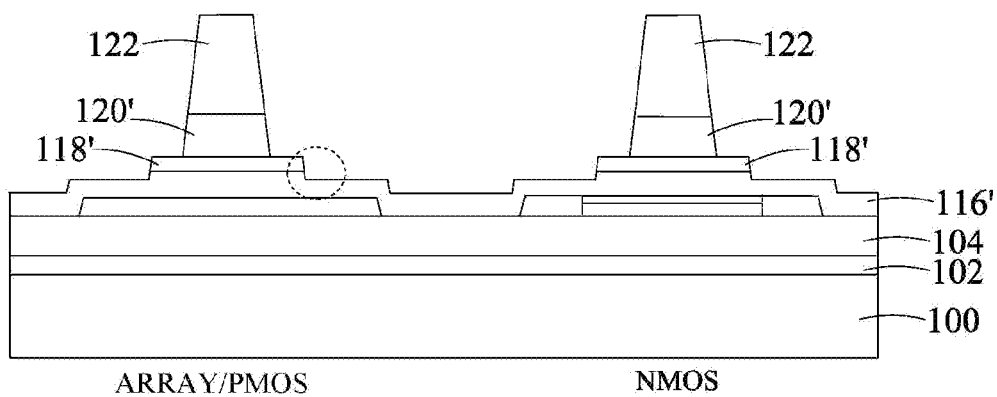
FIGS. 1 and 2 illustratively show schematic diagrams of silicon oxide loss which occurs when manufacturing a TFT.
Figure 2:
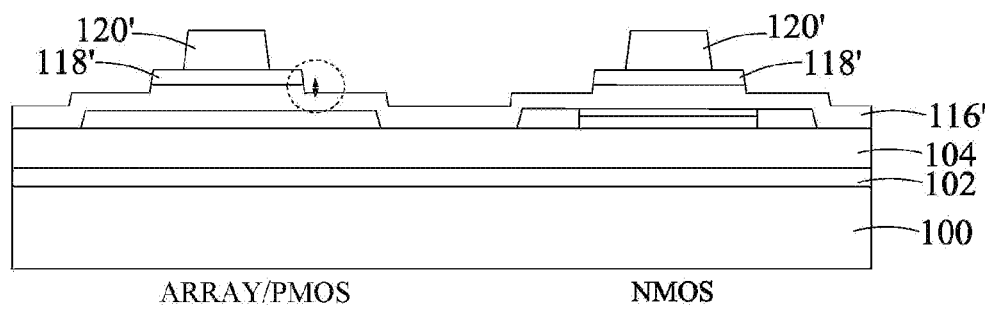

Now, exemplary implementations will be described more comprehensively with reference to the drawings. However, the exemplary implementations may be carried out in various manners, and shall not be interpreted as being limited to the implementations set forth herein; instead, providing these implementations will make the present disclosure more comprehensive and complete and will fully convey the conception of the exemplary implementations to one of ordinary skill in this art. In the drawings, thicknesses of regions and layers are exaggerated for the sake of clarity. Throughout the drawings similar reference signs indicate the same or similar structures, and their detailed description will be omitted.

In addition, the features, structures or characteristics described herein may be combined in one or more embodiments in any suitable manner. In the following description, many specific details are provided to facilitate sufficient understanding of the embodiments of the present disclosure. However, one of ordinary skill in this art will appreciate that the technical solutions in the present disclosure may be practiced without one or more of the specific details, or other methods, elements, materials and so on may be employed. In other conditions, well-known structures, materials or operations are not shown or described in detail to avoid confusion of respective aspects of the present disclosure.

FIGS. 3, 4, 5, 6, 7, 8, 9, 10 and 11 illustratively show schematic diagrams of respective stages of a method for manufacturing an AMOLED array substrate according to a first exemplary implementation of the present disclosure. By the shown manufacturing method, a PMOS TFT and/or a NMOS TFT used for an AMOLED array substrate and having no silicon oxide loss according to an exemplary implantation of the present disclosure may be manufactured on a substrate. However, the present disclosure is not limited thereto, and the method according to the present disclosure may also be used for manufacturing a TFT of other assemblies.

Figure 3:
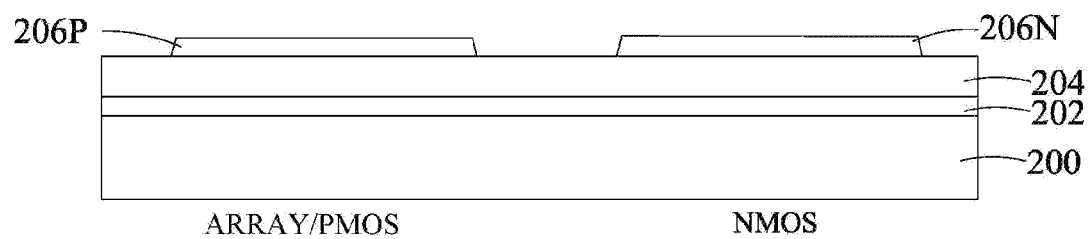
FIGS. 3, 4, 5, 6, 7, 8, 9, 10, 11, 12, 13, 14, 15, 16 and 17 illustratively show schematic diagrams of respective stages of a method for manufacturing an AMOLED array substrate according to a first exemplary implementation of the present disclosure.

Referring to FIG. 3, in the method for manufacturing an AMOLED assembly according to a first exemplary implementation of the present disclosure, firstly, a substrate 200 including a buffer layer thereon is prepared. The substrate 200 may be a glass substrate or a flexible substrate, or may be other suitable substrates. The buffer layer may include a silicon nitride layer 202 and a silicon oxide layer 204 on the silicon nitride layer. However, the present application is not limited thereto.

Optionally, an upper surface of the silicon oxide layer may be processed using one of $O_2$, $N_2$, $NH_3$, and $H_2$, so as to reduce the amount of defects such as dangling bond to suppress an interface leakage current.

Then, semiconductor layers 206P and 206N are formed on the substrate. The semiconductor layers may include a LTPS layer.

For example, an amorphous silicon (a-Si) thin film may be formed on the substrate by methods such as Plasma Enhanced Chemical Vapor Deposition (PECVD), and then the amorphous silicon is crystallized by methods such as Excimer Laser Annealing (ELA), and thereby a poly-silicon (Poly-Si) film may be obtained. Then, a photoresist is formed on the substrate, and using photolithography, a photoresist pattern may be obtained by patterning. Using the photoresist pattern as a mask, the poly-silicon film is patterned so as to form a plurality of semiconductor layers 206P and 206N. Then, the photoresist pattern is peeled off.

Figure 4:
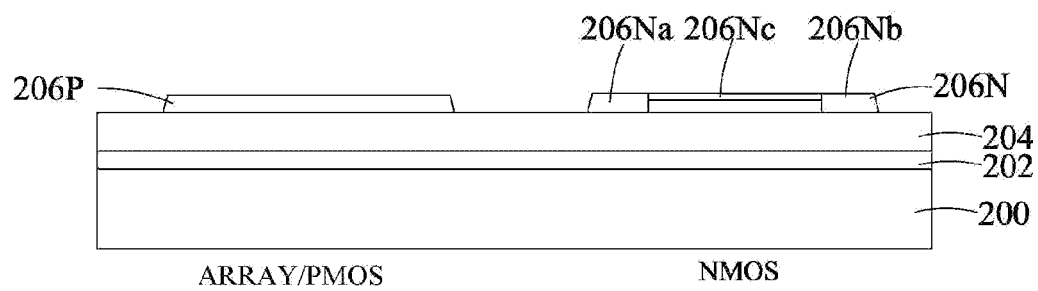

Next, channel surface doping may be performed on the semiconductor layers 206P and 206N so as to adjust a threshold voltage Vth. For example, the channel surface doping may be performed simultaneously on the semiconductor layers 206P and 206N by using $BF_3$. Then, a photoresist is formed on a resulted structure and patterning is performed, exposing regions where a NMOS TFT is to be formed, so as to perform a secondary channel implantation on the semiconductor layer of the NMOS TFT using P type dopant such as $BF_3$. Next, after removing the photoresist pattern, another photoresist pattern is formed on a resulted structure, exposing predetermined regions where a source region/a drain region of the NMOS TFT is to be formed. The predetermined regions where the source region/drain region of the semiconductor layer of the NMOS TFT is to be formed are doped with N type impurities such as P or As so as to form the source region and the drain region. Then, the photoresist pattern is peeled off. The resulted structure is shown in FIG. 4, in which a semiconductor active layer of the NMOS TFT includes a source region 206Na, a drain region 206Nb, and a middle part 206Nc between the source region 206Na and the drain region 206Nb.

Figure 5:
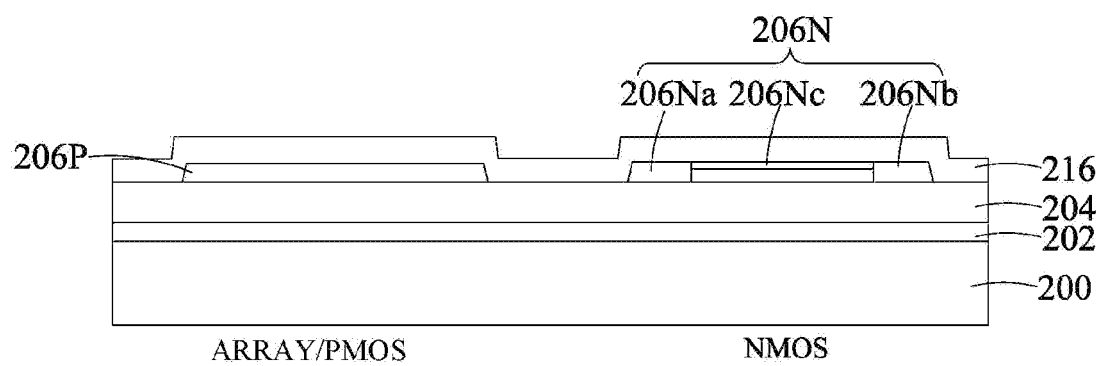

As shown in FIG. 5, a first gate insulating layer 216 covering the semiconductor layers is formed using methods such as Chemical Vapor Deposition (CVD). The first gate insulating layer 216 may be a silicon oxide layer, for example.

Figure 6:
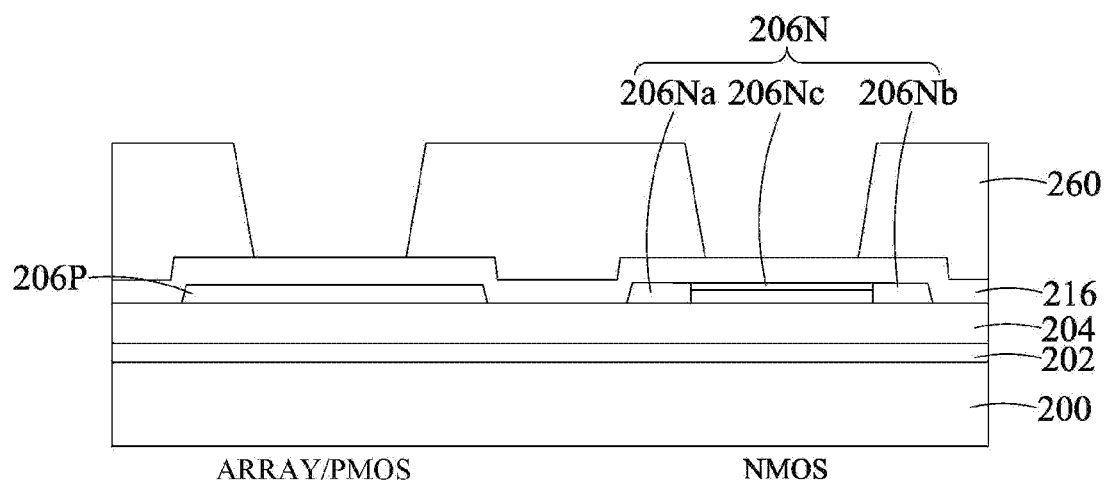

Referring to FIG. 6, a photoresist layer covering the first gate insulating layer 216 is formed and patterning is performed so as to form a photoresist pattern 260. The photoresist pattern 260 has an opening 2602 exposing a middle part between the semiconductor layers 206N and 206P.

Figure 7:
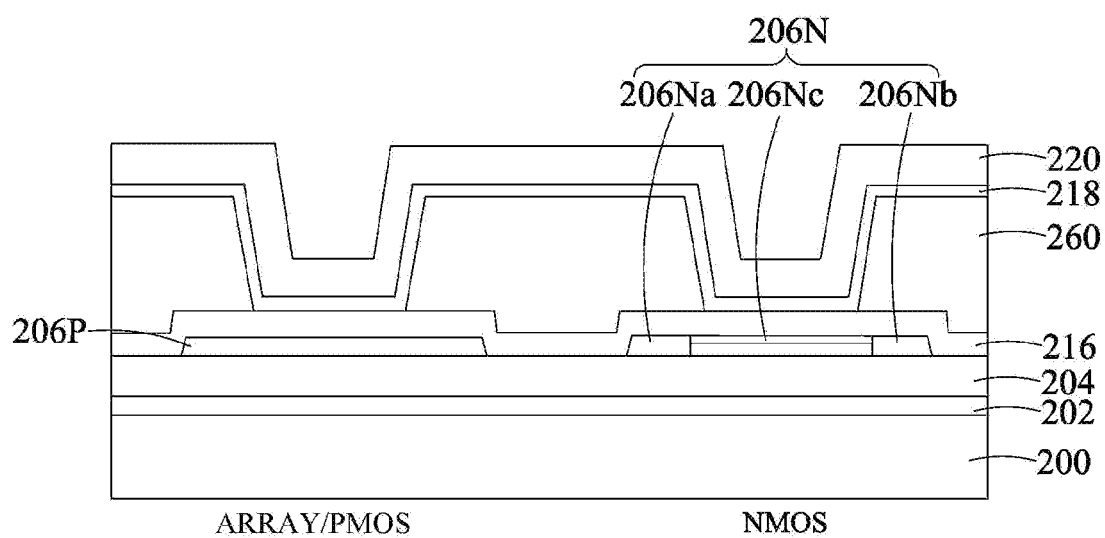

Referring to FIG. 7, a second gate insulating layer 218 is deposited on a resulted structure. The second gate insulating layer 218 may be a silicon nitride material layer, for example. A gate metal layer 220 is deposited on the second gate insulating layer 218. Metal such as molybdenum (Mo), aluminum, an alloy of aluminum and nickel, an alloy of molybdenum and tungsten, chromium, or copper is usually used for the gate metal layer. A combination of thin films of some of the above materials may also be used. In the present exemplary implementation, Mo is used as the gate metal layer 220. The second gate insulating layer 218 and the gate metal layer 220 cover an upper surface of the photoresist pattern 260 and sidewall surfaces within the opening 2602.

Figure 8:
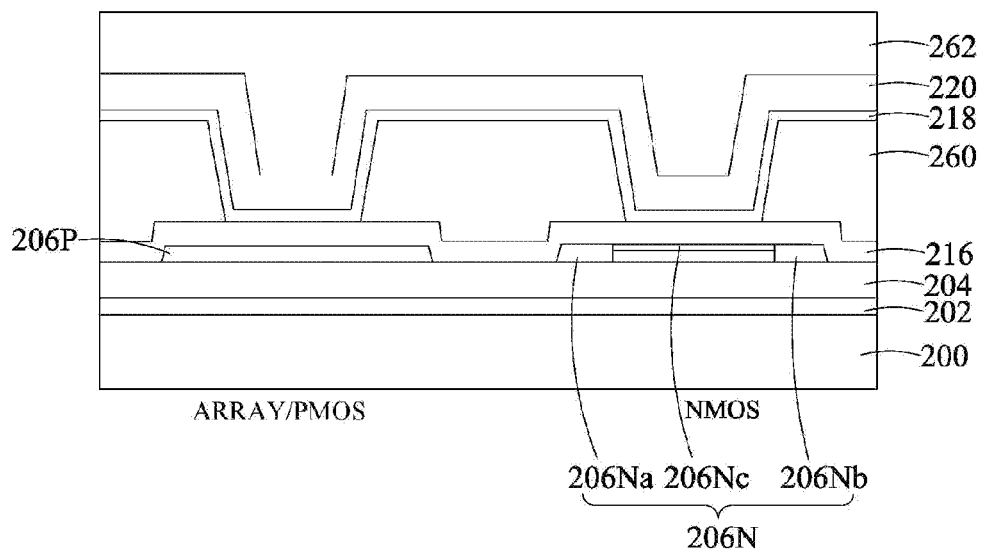

Referring to FIG. 8, a photoresist layer 262 is applied on a resulted structure and is baked. The photoresist layer 262 fills the opening 2602 and covers a top portion of the gate metal layer 220.

Figure 9:
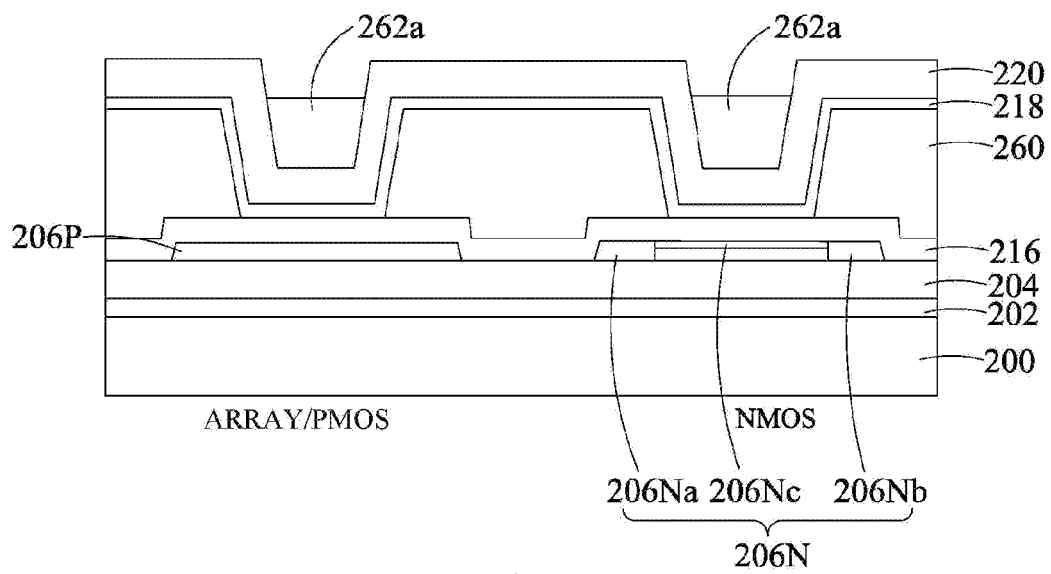

Referring to FIG. 9, a part of the photoresist layer 262 is removed by ashing process, for example, and a photoresist pattern 262a is left in the opening 2602. A top surface of the photoresist pattern 262a needs to be lower than a top surface of the gate metal layer 220. If the top surface of the photoresist pattern 262a is higher than the top surface of the gate metal layer 220, then in the process for removing a part of the gate metal layer 220 using wet etching, since there exists photoresist on the gate metal layer, the gate metal layer will not be removed by wet etching.

Figure 10:
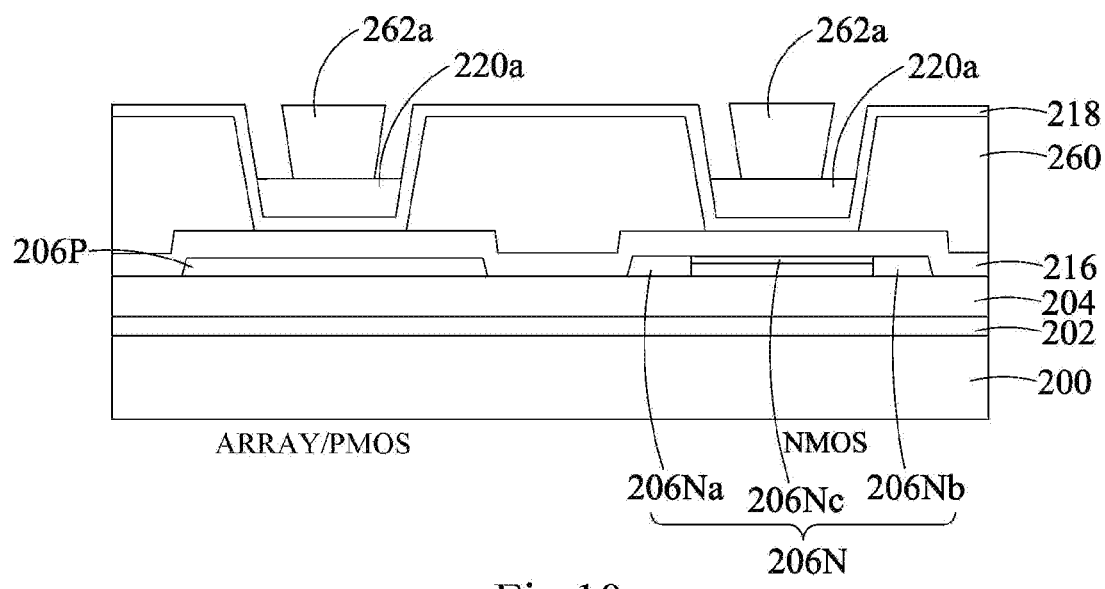

Referring to FIG. 10, using the photoresist pattern 262a as a mask, a part of the gate metal layer 220 is selectively removed by wet etching so as to form a gate metal pattern 220a. An exposed upper surface of the gate metal pattern 220a is substantially flush with an upper surface of the gate metal pattern 220a below the photoresist pattern 262a.

Figure 11:
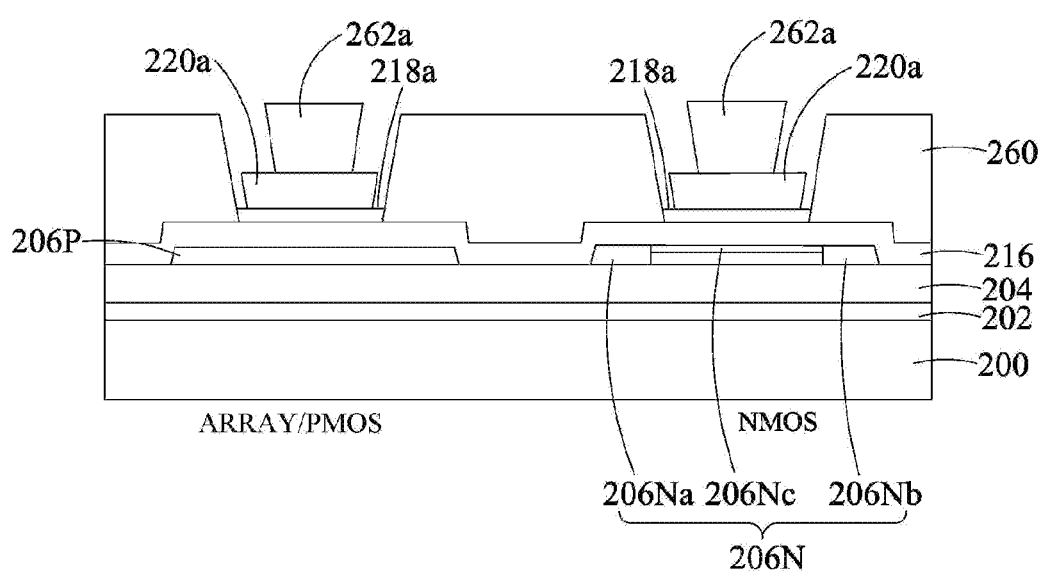

Referring to FIG. 11, using the photoresist pattern 262a and the gate metal pattern 220a as masks, a part of the second gate insulating layer 218 is selectively removed by wet etching to form a second gate insulating layer foot 218a. An exposed upper surface of the second gate insulating layer foot 218a is substantially flush with an upper surface of the second gate insulating layer foot 218a below the gate metal pattern 220a.

Figure 12:
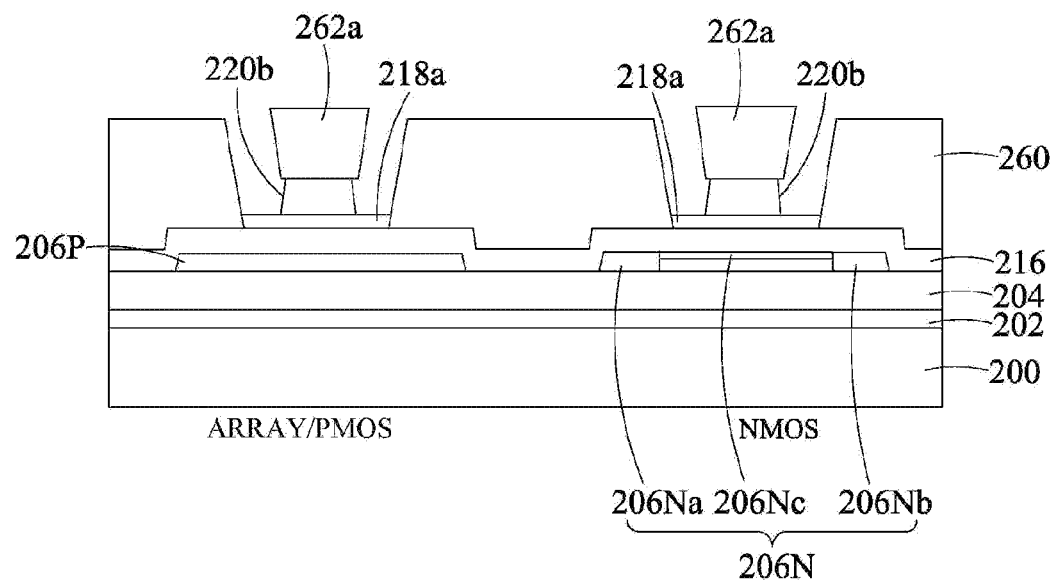

Referring to FIG. 12, using the photoresist pattern 262a as a mask, a secondary etching is performed on the gate metal pattern 220a by wet etching to obtain a gate electrode 220b. A width of the gate electrode 220b corresponds to a width of the channel region.

Figure 13:
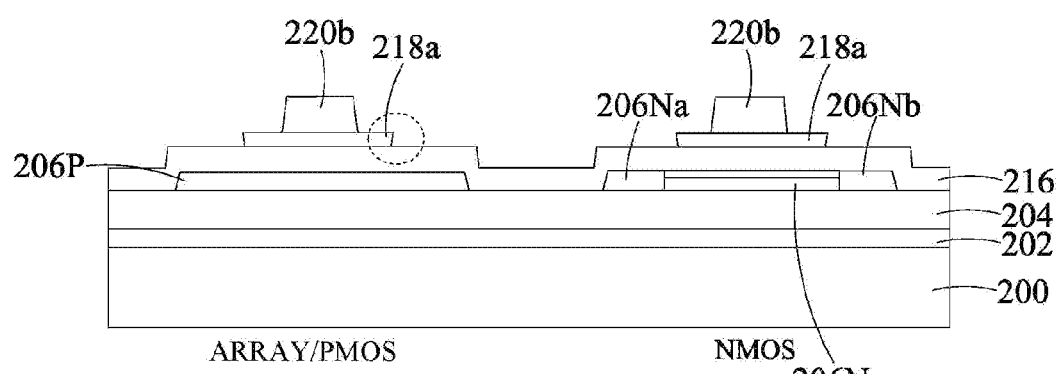

Then, the photoresist pattern 260 and the photoresist pattern 262a are peeled off, obtaining a structure having no first gate insulating layer loss, as shown in FIG. 13. Referring to the part as indicated by the circle in FIG. 13, there is no silicon oxide loss.

Figure 14:
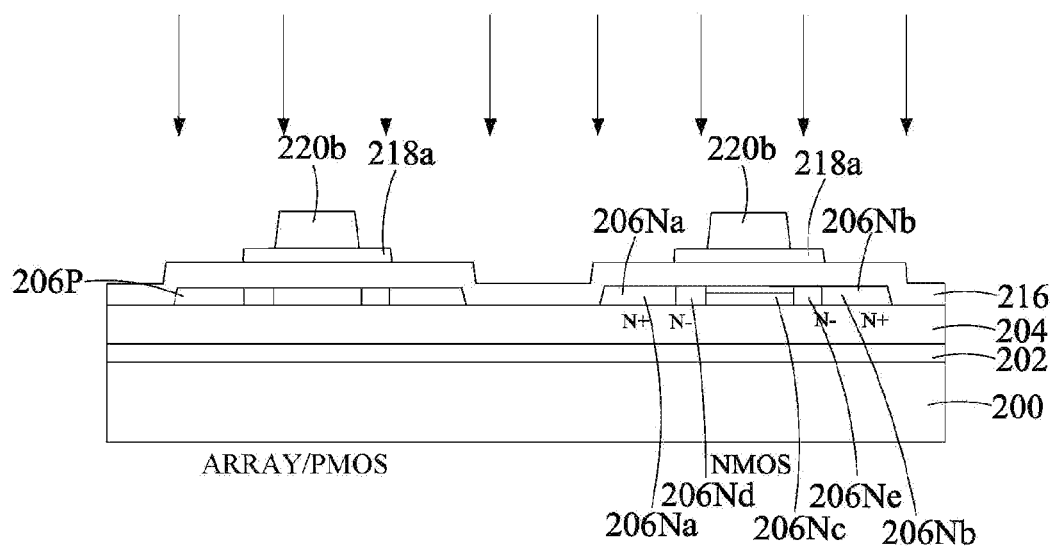

Next, optionally, referring to FIG. 14, using the gate structure including the gate electrode 220b and the silicon nitride foot 218a as a mask, N-doping is performed on the semiconductor layer of the NMOS using dopant such as P or As, so as to obtain Lightly Doped Drain (LDD) regions 206Nd and 206Ne of the NMOS TFT.

Figure 15:
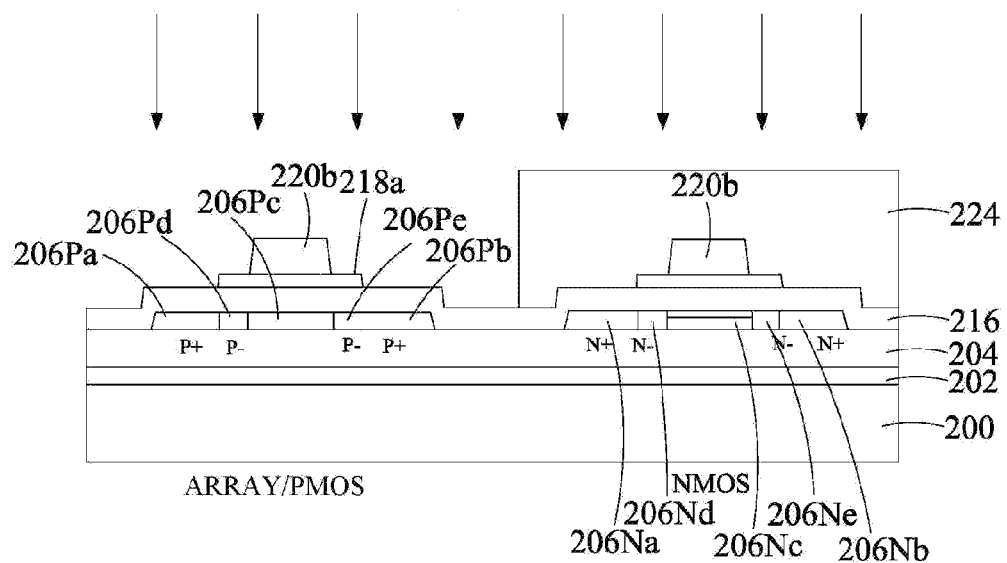

Next, referring to FIG. 15, a photoresist is formed on a resulted structure and patterning is performed to form a photoresist pattern 224. The photoresist pattern 224 exposes a PMOS region and covers the NMOS region. Using the gate structure including the gate electrode 220 band the silicon nitride foot 218a as a mask, P type dopant such as $BF_3$ is injected into the semiconductor layer of the PMOS TFT by ion implantation so as to form a source region 206Pa and a drain region 206Pb of the PMOS TFT. Because of the structure of the silicon nitride foot, P type LDD regions 206Pd and 206Pe may be formed in a self-alignment manner in this process. Then, the photoresist pattern is peeled off.

The LDD regions may avoid occurrence of short channel effect and hot carrier effect when size of assembly of a high resolution display is relatively small. Furthermore, a phenomenon of the assembly failure and collapse and a large leakage current will not occur when the assembly is operating under a relatively high voltage.

Figure 16:
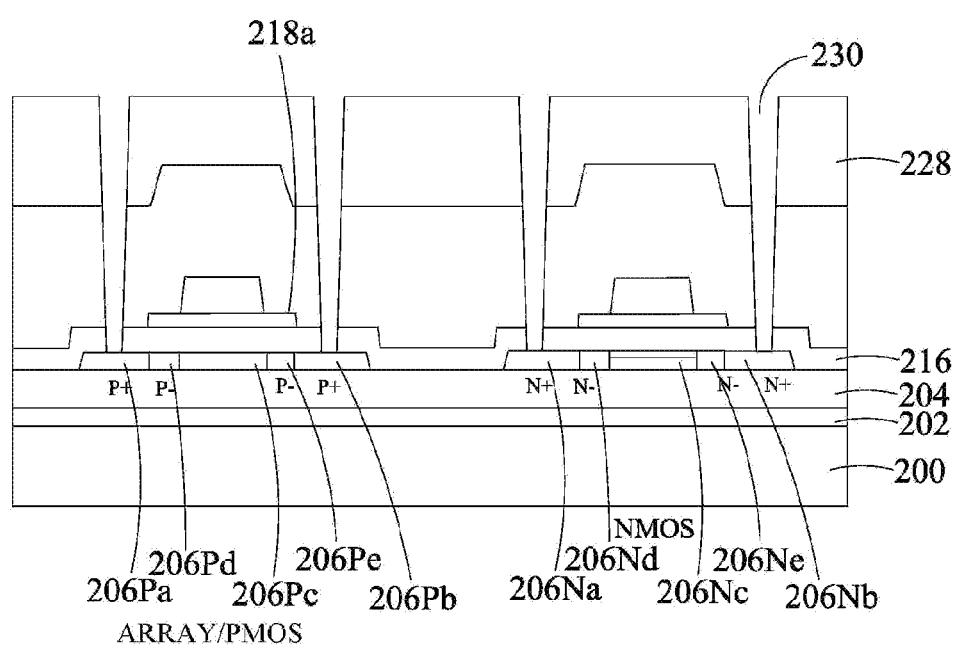
Figure 17:
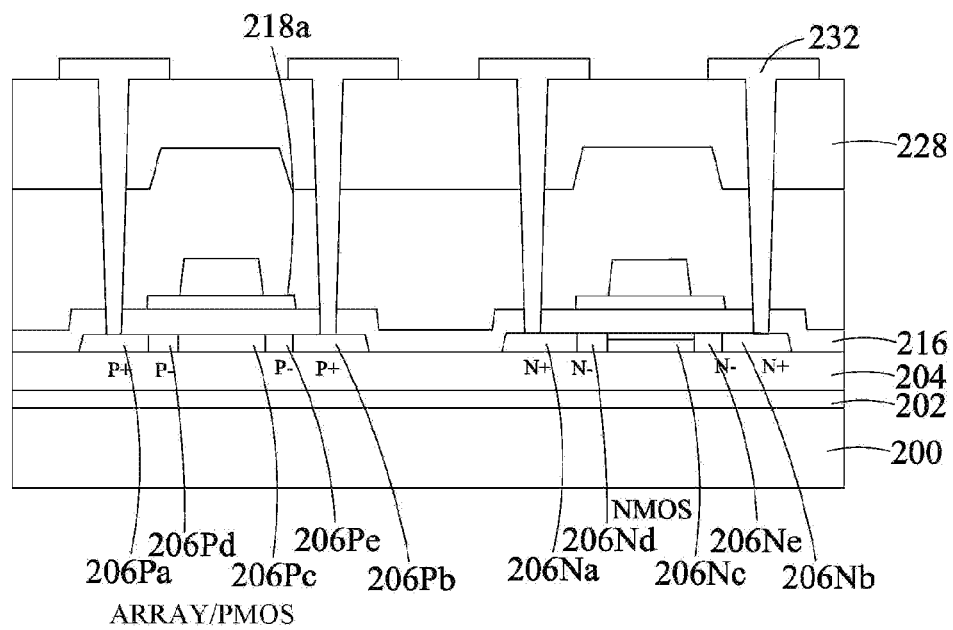

Next, as shown in FIG. 16, subsequent processes are performed on a resulted structure.

The subsequent processes are similar to conventional processes, and their detailed descriptions are omitted herein. For example, interlayer dielectric layers 226 and 228 are formed on a resulted structure. An etching masking pattern is formed on the interlayer dielectric layers. Contact holes 230 exposing the source region and the drain region of the TFT are formed by etching. A data line layer is deposited on a resulted structure and the contact holes are filled. A data wiring including a source electrode/drain electrode 232 is formed by patterning. The source electrode/drain electrode 232 is electrically connected with the source region/drain region of the TFT via the contact holes 230. Then, a process for forming a passivation layer covering the data wiring and other subsequent processes may be performed.

A method for manufacturing an AMOLED array substrate according to a second exemplary implementation of the present disclosure will be described below with reference to FIGS. 18, 19, 20, 21, 22 and 23.

The method for manufacturing an AMOLED array substrate according to the second exemplary implementation of the present disclosure is substantially the same as that of the first exemplary implementation, and the difference only lies in that the etching of the second gate insulating layer is different. For conciseness, same descriptions as the first exemplary implementation will be omitted.

Figure 18:
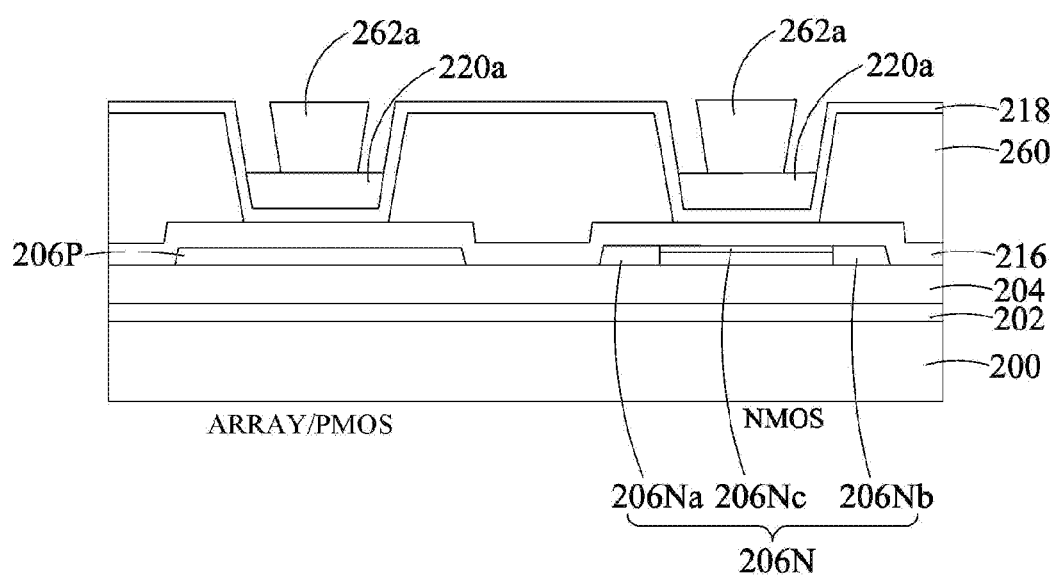
FIGS. 18, 19, 20, 21, 22 and 23 illustratively show schematic diagrams of respective stages of a method for manufacturing an AMOLED array substrate according to a second exemplary implementation of the present disclosure.
Figure 19:
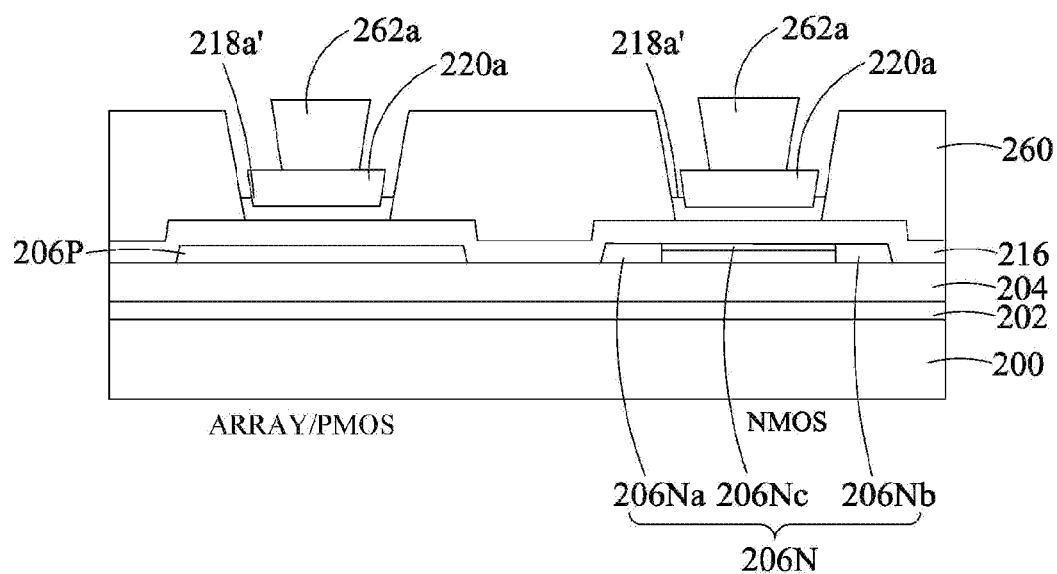

Referring to FIGS. 18 and 19, after forming the gate metal pattern 220a by etching, using the photoresist pattern 262a and the gate metal pattern 220a as masks, a part of the second gate insulating layer 218 is selectively removed by wet etching so as to form a second gate insulating layer foot 218a'. Different from the first exemplary implementation, an exposed upper surface of the second gate insulating layer foot 218a' is higher than an upper surface of the second gate insulating layer foot 218a' below the gate metal pattern 220a. That is, an edge of the second gate insulating layer foot 218a' has a protrusion.

Figure 20:
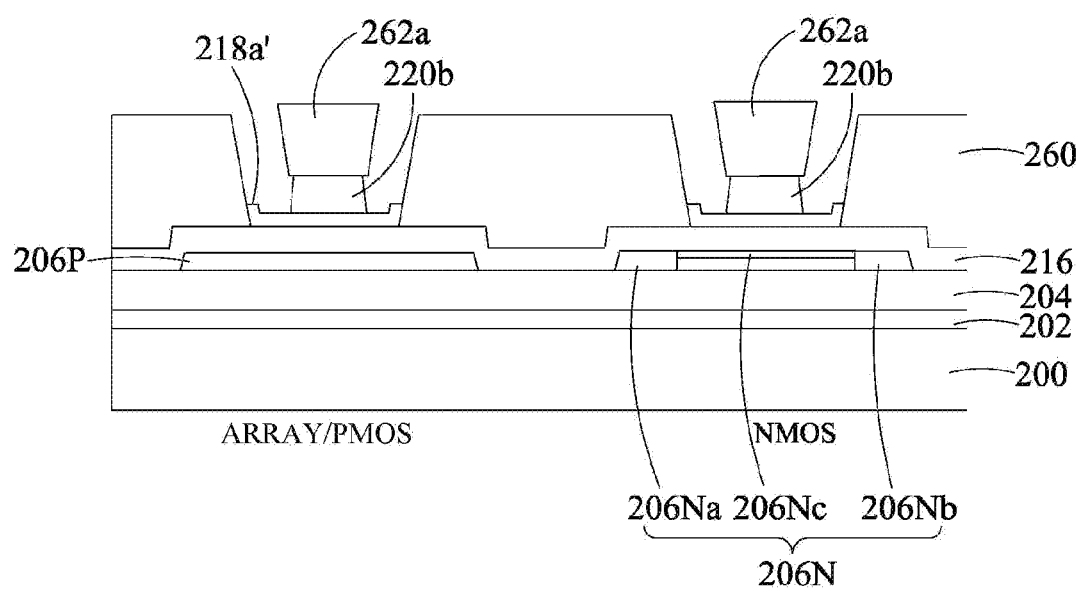

Referring to FIG. 20, using the photoresist pattern 262a as a mask, a secondary etching is performed on the gate metal pattern 220a by wet etching to obtain a gate electrode 220b. A width of the gate electrode 220b corresponds to a width of a channel region. A semiconductor region below the gate electrode 220b is the channel region.

Figure 21:
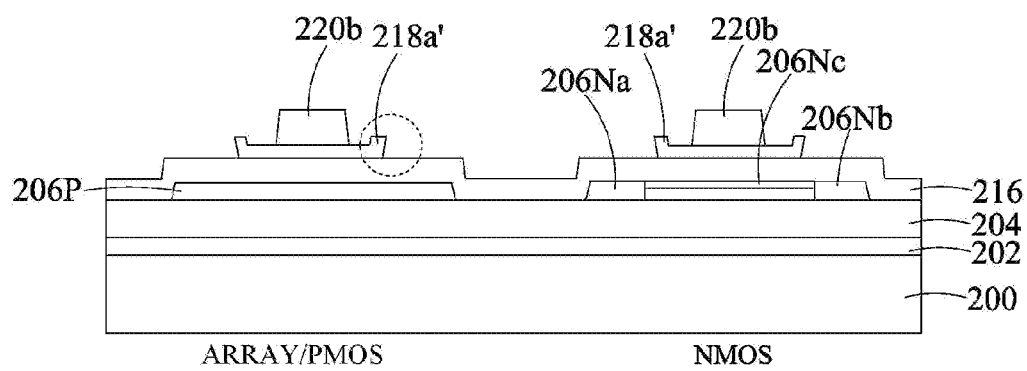

Then, the photoresist pattern 260 and the photoresist pattern 262a are peeled off so as to obtain a structure having no first gate insulating layer loss, as shown in FIG. 21. Referring to the part indicated by the circle in FIG. 21, there is no silicon oxide loss.

Figure 22:
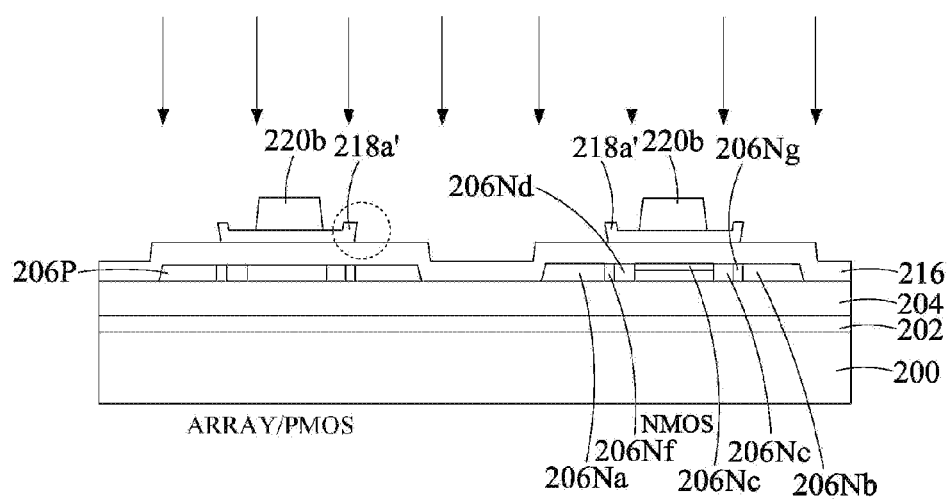

Next, referring to FIG. 22, using the gate structure including the gate electrode 220b and the silicon nitride foot 218a' as a mask, self-alignment N-doping is performed on the semiconductor layer of the NMOS using dopant such as P or As, so as to obtain first LDD regions 206Nd and 206Ne of the NMOS TFT. The first LDD regions 206Nd and 206Ne are adjacent to the channel region. Meanwhile, second LDD regions 206Nf and 206Ng having a doping concentration lower than that of the first LDD regions 206Nd and 206Ne may be obtained. The second LDD regions 206Nf and 206Ng are adjacent to the first LDD regions 206Nd and 206Ne respectively so as to form series LDD regions.

Figure 23:
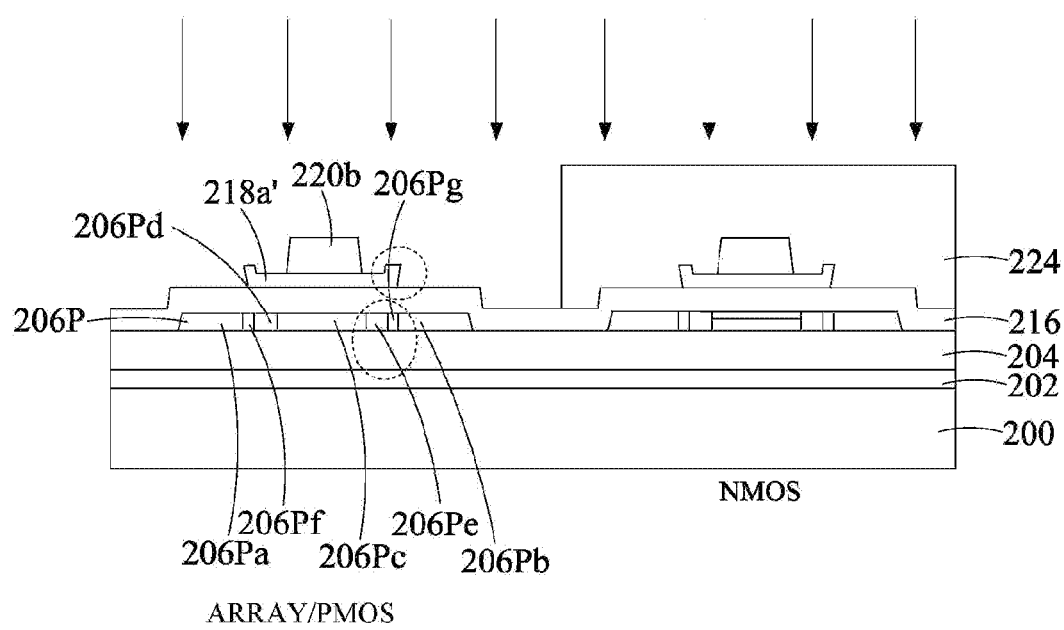

Next, referring to FIG. 23, a photoresist is formed on a resulted structure and patterning is performed to form a photoresist pattern 224. The photoresist pattern 224 exposes a PMOS region and covers the NMOS region. Using the gate structure including the gate electrode 220b and the silicon nitride foot 218a' as a mask, P type dopant such as $BF_3$ is injected into the semiconductor layer of the PMOS TFT by ion implantation so as to form a source region 206Pa and a drain region 206Pb of the PMOS TFT. Because of the structure of the silicon nitride foot, P type LDD regions 206Pd and 206Pe and the second LDD regions 206Pf and 206Pg (the second LDD regions 206Pf and 206Pg having a doping concentration lower than that of first LDD regions 206Pd and 206Pe) are formed in a self-alignment manner in this process. The first LDD regions 206Pd and 206Pe and the second LDD regions 206Pf and 206Pg are adjacent to each other so as to form series LDD regions. A semiconductor region below the gate electrode 220b is the channel region.

The exemplary implementations of the present disclosure are described above in detail. According to the exemplary implementation of the present disclosure, after the deposition of $SiO_2$, a gate region is defined using a photoresist (PR), and then a SiN layer and a gate metal layer are deposited. A part of the gate metal layer is removed using wet etching, and then the SiN on the sidewalls is removed so as to define a SiN foot. Next, a gate electrode is defined by wet etching. Since there is no $SiO_2$ loss in the SiN process, better dopant implantation profiles of the source region and the drain region may be obtained, and thereby better uniformity in TFT performance may be obtained. In addition, because $SiO_2$ loss is reduced, a gate breakdown voltage may be increased higher, and Gate-Induced Drain Leakage (GIDL) current may be decreased.

According another exemplary implementation, when the SiN is etched as having a protrusion at its edge, series LDDs may be formed in the active layer by ion implantation process. The series LDDs may further reduce Ioff (off current) of the TFT.

According to the exemplary implementations, since better uniformity of TFT may be obtained, image quality of a display may be increased. In addition, in the AMOLED array substrate including TFTs manufactured by employing the method according to the present disclosure, the leakage current in a switching transistor may be reduced, thereby avoiding instability and even failure in the operation of the assembly caused by overlarge leakage current. It shall be appreciated that the technical solutions according to the present disclosure may also be applied in next generation of displays such as LTPS-LCD, etc.

The exemplary implementations of the present disclosure are shown and described above in detail. It shall be appreciated that the present disclosure is not limited to the disclosed implementations, and instead, the present disclosure intends to encompass various modifications and equivalent arrangements within the spirit and scope of the appended claims.

What is claimed is:

1. A thin film transistor, comprising:
   a substrate;
   a buffer layer formed on the substrate;
   a semiconductor layer formed on the buffer layer, the semiconductor layer comprising a source region, a drain region and a channel region;
   a first gate insulating layer configured to cover the semiconductor layer, the first gate insulating layer comprising a first width;
   a second gate insulating layer foot formed on the first gate insulating layer, the second gate insulating layer foot being made by different material with the first gate insulating layer and comprising a second width, the width of the second gate insulating layer foot being smaller than the width of the first gate insulating layer; and
   a gate electrode formed on the second gate insulating layer foot;
   wherein a part of the first gate insulating layer on the semiconductor layer has a flat upper surface, and
   wherein the semiconductor layer further comprises two second lightly doped drain regions respectively adjacent to the source region and the drain region and two first lightly doped drain regions respectively adjacent to the two second lightly doped drain regions, and the second lightly doped drain regions have a doping concentration lower than that of the first lightly doped drain regions.

2. The thin film transistor according to claim 1, wherein the gate electrode is formed of at least one material selected from the group consisting of molybdenum, aluminum, an alloy of aluminum and nickel, an alloy of molybdenum and tungsten, chromium, and copper.

3. The thin film transistor according to claim 1, wherein the second gate insulating layer foot has a protrusion, such that a partial thickness of the second gate insulating layer foot is larger than the rest of the second gate insulating layer foot.

4. The thin film transistor according to claim 1, wherein an exposed upper surface of the second gate insulating layer foot is substantially flush with an upper surface of the second gate insulating layer foot below a gate metal pattern forming the gate electrode.

5. The thin film transistor according to claim 1, wherein an exposed upper surface of the second gate insulating layer foot is higher than an upper surface of the second gate insulating layer foot below a gate metal pattern forming the gate electrode.

6. An active matrix organic light emitting diode assembly with a thin film transistor, wherein the thin film transistor comprises:
   a substrate;
   a buffer layer formed on the substrate;
   a semiconductor layer formed on the buffer layer, the semiconductor layer comprising a source region, a drain region and a channel region;
   a first gate insulating layer configured to cover the semiconductor layer, the first gate insulating layer comprising a first width;
   a second gate insulating layer foot formed on the first gate insulating layer, the second gate insulating layer foot being made by different material with the first gate insulating layer and comprising a second width, the width of the second gate insulating layer foot being smaller than the width of the first gate insulating layer; and
   a gate electrode formed on the second gate insulating layer foot;

wherein a part of the first gate insulating layer on the semiconductor layer has a flat upper surface, and wherein the semiconductor layer further comprises two second lightly doped drain regions respectively adjacent to the source region and the drain region and two first lightly doped drain regions respectively adjacent to the two second lightly doped drain regions, and the second lightly doped drain regions have a doping concentration lower than that of the first lightly doped drain regions.

7. The active matrix organic light emitting diode assembly according to claim 6, wherein the gate electrode is formed of at least one material selected from the group consisting of molybdenum, aluminum, an alloy of aluminum and nickel, an alloy of molybdenum and tungsten, chromium, and copper.

8. The active matrix organic light emitting diode assembly according to claim 6, wherein the second gate insulating layer foot has a protrusion, such that a partial thickness of the second gate insulating layer foot is larger than the rest of the second gate insulating layer foot.

9. The active matrix organic light emitting diode assembly according to claim 6, wherein an exposed upper surface of the second gate insulating layer foot is substantially flush with an upper surface of the second gate insulating layer foot below a gate metal pattern forming the gate electrode.

10. The active matrix organic light emitting diode assembly according to claim 6, wherein an exposed upper surface of the second gate insulating layer foot is higher than an upper surface of the second gate insulating layer foot below a gate metal pattern forming the gate electrode.

* * * * *